(12) United States Patent
Young

(10) Patent No.: US 6,982,876 B1
(45) Date of Patent: Jan. 3, 2006

(54) PRINTED CIRCUIT BOARD ASSEMBLY

(75) Inventor: George Young, Dublin (IE)

(73) Assignee: Commergy Technologies Limited, Dublin (IE)

( * ) Notice: Subject to any disclaimer, the term of this patent is extended or adjusted under 35 U.S.C. 154(b) by 300 days.

(21) Appl. No.: 10/070,742

(22) PCT Filed: Sep. 13, 2000

(86) PCT No.: PCT/IE00/00106

§ 371 (c)(1),
(2), (4) Date: Apr. 30, 2002

(87) PCT Pub. No.: WO01/20955

PCT Pub. Date: Mar. 22, 2001

(30) Foreign Application Priority Data

Sep. 13, 1999 (IE) .............................................. S990765
Dec. 6, 1999 (IE) .............................................. S991024

(51) Int. Cl.
*H05K 7/20* (2006.01)

(52) U.S. Cl. ....................... 361/719; 361/704; 361/760; 257/712; 174/252; 165/80.3; 165/185

(58) Field of Classification Search ................. 361/690, 361/703–705, 709–713, 717–721, 752, 758, 361/790; 174/16.3, 252; 165/80.3, 185
See application file for complete search history.

(56) References Cited

U.S. PATENT DOCUMENTS

| 4,712,160 | A |   | 12/1987 | Sato et al. |          |
|-----------|---|---|---------|-------------|----------|
| 4,803,590 | A |   | 2/1989  | Fassel et al. |        |
| 5,019,941 | A |   | 5/1991  | Craft       |          |
| 5,079,672 | A |   | 1/1992  | Haubner et al. |       |
| 5,384,683 | A | * | 1/1995  | Tsunoda ..................... 361/313 |
| 5,734,555 | A | * | 3/1998  | McMahon ................. 361/704 |
| 5,926,944 | A | * | 7/1999  | Smith et al. ............... 29/602.1 |
| 5,973,923 | A | * | 10/1999 | Jitaru ........................ 361/704 |
| 6,005,773 | A | * | 12/1999 | Rozman et al. ............. 361/707 |
| 6,091,604 | A | * | 7/2000  | Plougsgaard et al. ....... 361/707 |
| 6,222,733 | B1| * | 4/2001  | Gammenthaler ........... 361/705 |
| 6,459,586 | B1| * | 10/2002 | Miller et al. ................ 361/719 |

FOREIGN PATENT DOCUMENTS

| DE | 197 07 702 A | 8/1998 |
| EP | 0 413 848 A | 2/1991 |
| EP | 0 531 687 A | 3/1993 |
| EP | 0 856 447 A | 8/1998 |
| EP | 0 896 419 A | 2/1999 |

OTHER PUBLICATIONS

Patent Abstract of Japan vol. 1995, No. 03, (Apr. 25, 1995).
Patent Abstract of Japan vol. 1998, No. 11, Sep. 30, 1998.
Patent Abstract of Japan vol. 7, No. 111 (E–175), May 14, 1983.
Patent Abstracts of Japan vol. 1997, No. 2, Feb. 28, 1997.
Patent Abstracts of Japan vol. 1996, No. 3, Mar. 29, 1996.

* cited by examiner

*Primary Examiner*—Boris Chervinsky
(74) *Attorney, Agent, or Firm*—Birch, Stewart, Kolasch & Birch, LLP

(57) ABSTRACT

A PCB assembly (1) in this case a DC-DC converter comprising a single layer board (2), mounts power semiconductor devices forming high heat generating components (3) and various cores of magnetic material forming heat dissipating components (4). Tracks of heat conductive coupling material (6) lie above or below each heat generating component (3) and project into one of the heat dissipating components (4) and beside the others. In one embodiment, the heat generating components (3) are housed within a heat dissipating component (3). In another PCB assembly, there is an additional plug-in PCB which may itself carry heat generating components (3) or only heat dissipating components (4). In the latter case, the heat generating components (3) are mounted on the PCB assembly below the additional plug-in PCB.

24 Claims, 8 Drawing Sheets

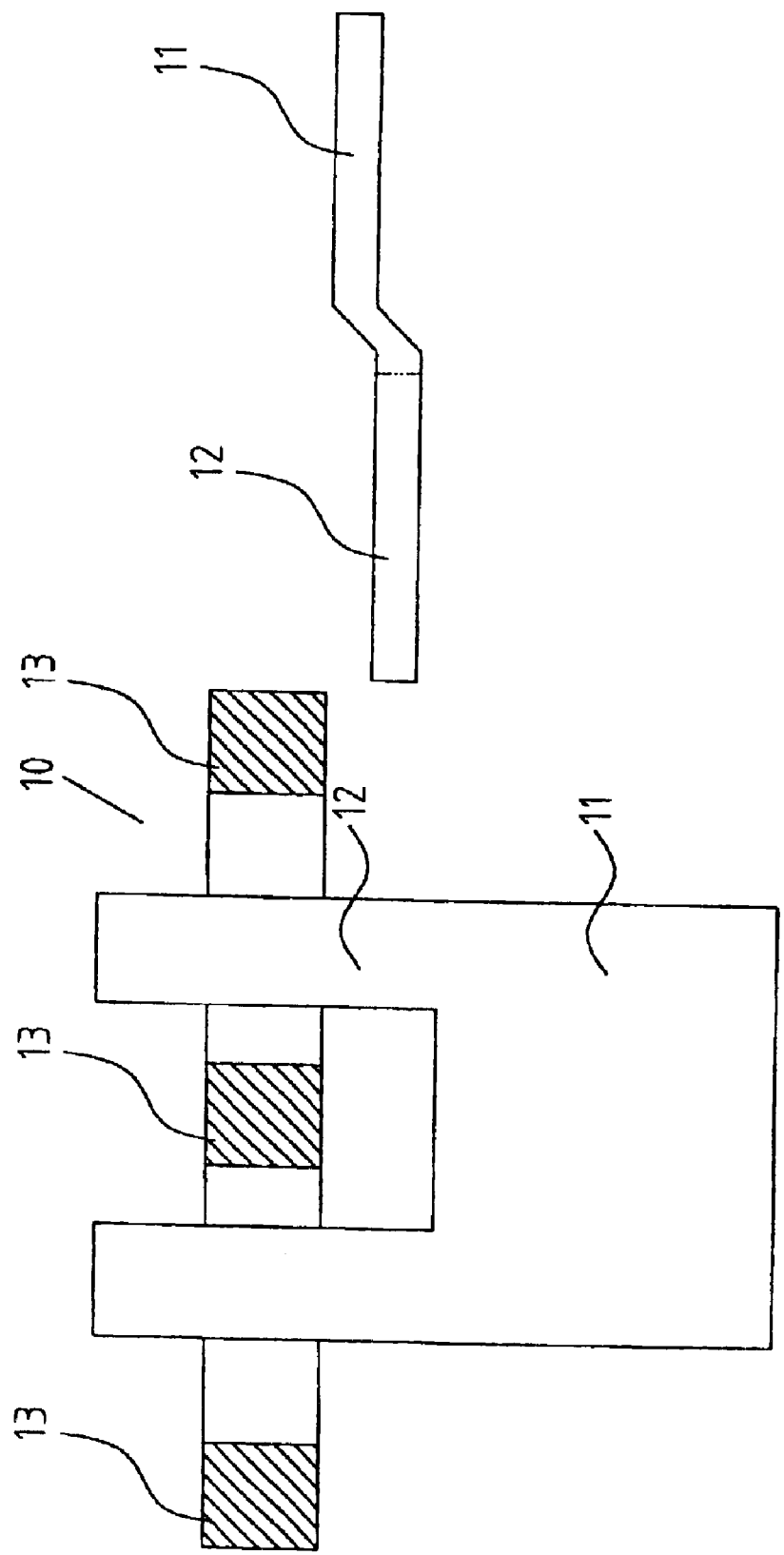

PRINTED CIRCUIT BOARD ASSEMBLY

This application is the national phase under 35 U.S.C. § 371 of PCT International Application No. PCT/IE00/00106 which has an International filing date of Sep. 13, 2000, which designated the United States of America.

INTRODUCTION

The present invention relates to a printed circuit board (PCB) assembly of the type comprising a plurality of components having different thermal attributes, namely, of different relative heat generating and heat dissipating properties over the operating range of the PCB. Further, the invention is particularly directed to the provision of PCBs for power conversion use, whether they be for DC to DC or AC to DC power converters.

The majority of power conversion products manufactured today use through-hole mounted components on a PCB with thermal management of the main power dissipating elements achieved either using small heatsinks for individual devices or groups of devices, or using a thermal-conductive mechanical assembly to couple such heat dissipating elements to an external heatsink. This construction technique is not compatible with modem automated manufacturing techniques and is not efficient in the context of volumetric efficiency, with a relatively large volume occupied by power dissipating elements and their heatsinking arrangements.

In more recent implementations, as available in many commercial DC-DC medium power converters (up to 100 W typically), the windings are integrated into a single multi-layer printed circuit board along with the power devices. Such DC-DC converters using integrated planar magnetics are manufactured by Philips or by Synqor Inc. which latter company sells such a converter under the Trade Mark PowerQor™. Typical examples of the terminal coupling for such multilayer printed circuit boards to metallic structures are described in U.S. Pat. Nos. 5,973,923 (Jitaru) and 5,990,776 (Jitaru). This single board construction technique is very practical for such medium-power DC-DC converters, and one element of the invention relates to techniques for improving heat management within such modules and in their mounting arrangements These modules up to recently favoured the use of enclosed constructions with the main heat-dissipation elements closely thermally coupled to a base plate, on which a heatsink could be mounted. In many cases, potting in a thermally-conductive material can be used, but this approach is costly, may raise environmental issues, prevents rework, and can cause stress on components even if a barrier layer is used. Recent practice has begun to favour the use of the single-board open frame construction, facilitated by use of semiconductor devices which can give high operating efficiency, and operating without an external heatsink. This practice makes thermal management within the module and to its environment more critical.

The single-board construction approach requires, however, an excessive area in the case of medium-power converters, particularly in the case of AC-DC converters where the minimum height is effectively determined by items such as electrolytic capacitors which must store energy during the low-voltage parts of the incoming AC waveform. As a result, such converters using the single-board multilayer approach will have poor volumetric efficiency, unless of course several lower power submodules are stacked in order to fit within the height constraints imposed by the electrolytic capacitor or a similar bulky element. This approach, however, adds to cost, as switching stages need to be replicated in each module and there is a cost associated with mounting and connecting the sub-modules, as well as the thermal management issues associated with a stack of converter sub-modules as part of an overall power conversion module.

The heat generation of any particular component in, for example, a PCB forming part of a power converter, will vary depending on the operating conditions of the power converter module. Typically, components in which conduction losses dominate will generate more heat at lower input voltage within the specified range, while components in which switching loss or magnetic core loss dominates may generate higher losses at higher input voltages. Thus, the term "heat generating" or "heat dissipating" when referring to the thermal attributes, capacities or properties of a particular component and similarly the qualifications high and low of such terms, refers not to the absolute heat generating or heat dissipating property or ability but simply to its property in that actual specific situation. The heat dissipation property of a component depends largely on its inherent physical make-up. Thus, large bulky metallic components with exposed surfaces will dissipate more heat than those smaller compact components low conductivity materials.

As the designs become more efficient, the operating temperature under which the components operate becomes more critical. While many of the approaches discussed above and many of the techniques such as, for example, the use of heatsinks such as described in U.S. Pat. No. 5,075,821 (Donnel), appreciate the need to dissipate the heat from some of the components with high heat generating capacity, not enough attention has been paid heretofore to the need to operate the magnetic elements, whether they be conventional magnetic elements or planar magnetic elements at the optimum temperatures. Indeed, many of the ferrite materials used-in magnetic elements are often optimised for operation at approximately 100° C. and thus, under typical ambient temperature and airflow conditions, the magnetic elements are not operating at the ideal temperature. Many of the power conversion modules of the prior art may cool the semi-conductor power components sufficiently but unfortunately do not operate with the magnetic components at the optimum temperature.

The present invention is directed towards overcoming these and other problems with the prior art and in particular to providing an improved construction of PCB and in particular an improved construction of PCB for use for power converter elements and also to the provision of an efficient magnetic element for use with such PCBs.

STATEMENTS OF INVENTION

According to the invention, there is provided a PCB assembly of the type comprising a plurality of components having different thermal attributes, namely, of different relative heating generating and heat dissipating properties over the operating range of the PCB wherein at least one high heat generating component is thermally linked to a high heat dissipating component. In this way, there is an active management of the thermal properties or generation of the PCB which can be particularly effective in power conversion units. The PCB no longer relies on, for example, heatsinks or the like which may be used to dissipate the heat from high heat generating components but utilises the heat dissipating properties of the high heat dissipating components.

Preferably, the components are thermally linked by a heat conductive coupling material which may, for example, be in direct contact with one or both of the components. Such heat conductive coupling material can be housed within at least one of the components. It will be appreciated that the advantage of this is that further heat dissipation will be achieved.

The heat conductive coupling material may form additional tracks on the board or additional pads and may form thermal vias with one component on one side of the board and the other components on the opposite side. These would be additional heat conductive tracks or pads, for example, of copper, over and above those used for the conduction of electrical signals. Additionally, a conformable thermally conductive material especially an electrically insulating one can be particularly useful with some components, particularly with non-planar surfaces. Indeed, electrical conductors could be made larger than necessary in certain situations to utilise the heat dissipating properties of them.

Ideally, the components are in close physical proximity with minimal air between them and in one embodiment of the invention, the heat generating component is housed at least partially within the heat dissipating component. Alternatively, the heat dissipating component can be mounted above the heat generating component which heat dissipating component can be a magnetic component. It will be appreciated that the great advantage for the magnetic component is that it is now receiving heat and being heated to allow the ferrite approach optimum thermal operating conditions.

In one embodiment of the invention, the magnetic element is a separate magnetic surface mount PCB carrying plug-in legs for mounting on the PCB. This surface mount PCB may be a multilayer circuit board. This latter surface mount PCB may form part of a power converter comprising power semi-conductors on the PCB below the surface mount PCB.

In this latter embodiment, preferably a layer of conformable thermally conductive material fills the space between the bottom of the surface mount PCB and the power semi-conductors.

It will be appreciated that ideally the heat dissipating component is thermally linked to more than one heat generating component or indeed more than one heat generating component is thermally linked to more than one heat dissipating component. When the heat generating and dissipating components have different thermal attributes over the PCB operating range, the choice of components for thermal linking is chosen to provide optimum heat transfer over the PCB operating range. Thus, it is possible that the two different heat generating components would be connected to the one heat dissipating component which heat dissipating component would not, in fact, over the total range of the operation of the PCB, experience any great fluctuation in the amount of heat transmitted thereto for subsequent dissipation.

Further, the invention provides a magnetic element for use with a base PCB comprising a separate magnetics element surface mount PCB carrying plug-in legs for mounting on the base PCB.

In this latter element, the surface mount PCB is a multilayer circuit board.

Further, the invention provides a power converter comprising one of these latter magnetic elements and power semi-conductor elements on the base PCB which preferably are so arranged that the surface mount PCB is above the power semi-conductors.

In this latter power converter, ideally a layer of conformable thermally conductive material fills the space between the bottom of the surface mount PCB and the power semi-conductors.

DETAILED DESCRIPTION OF THE INVENTION

The invention will be more clearly understood from the following description of some embodiments thereof, given by way of example only, with reference to the accompanying drawings, in which:

FIG. 3 is a plan view of a heat coupler according to the invention in an E-core;

FIG. 4 is a side view of the heat coupler of FIG. 3,

Figure 5:
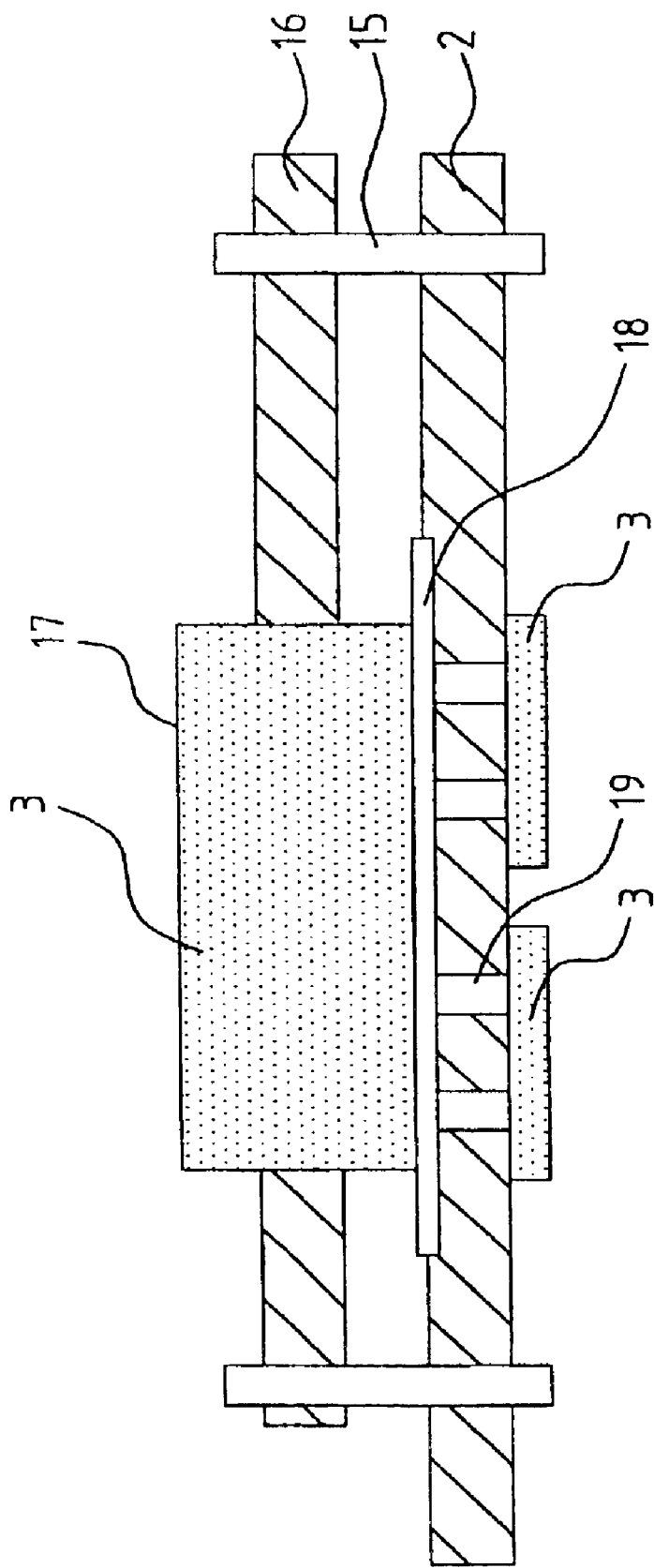
Figure 6:
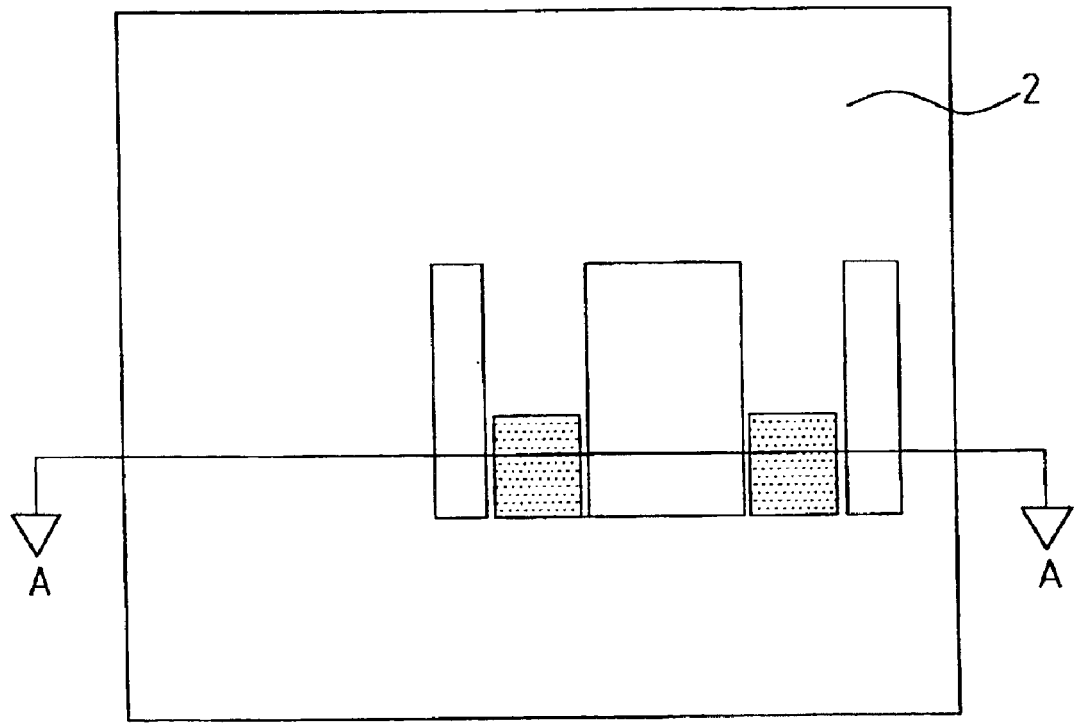
Figure 7:
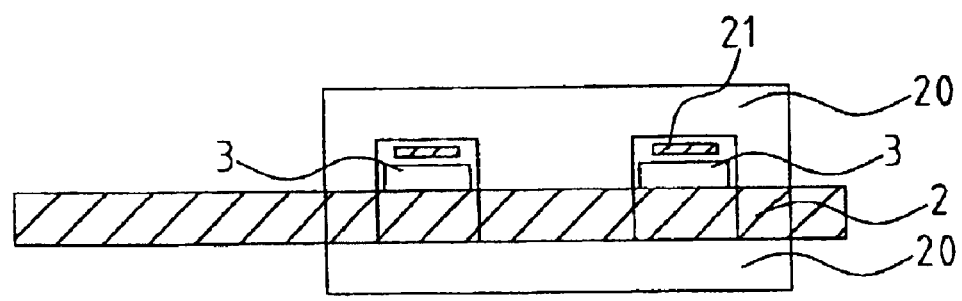
Figure 8:
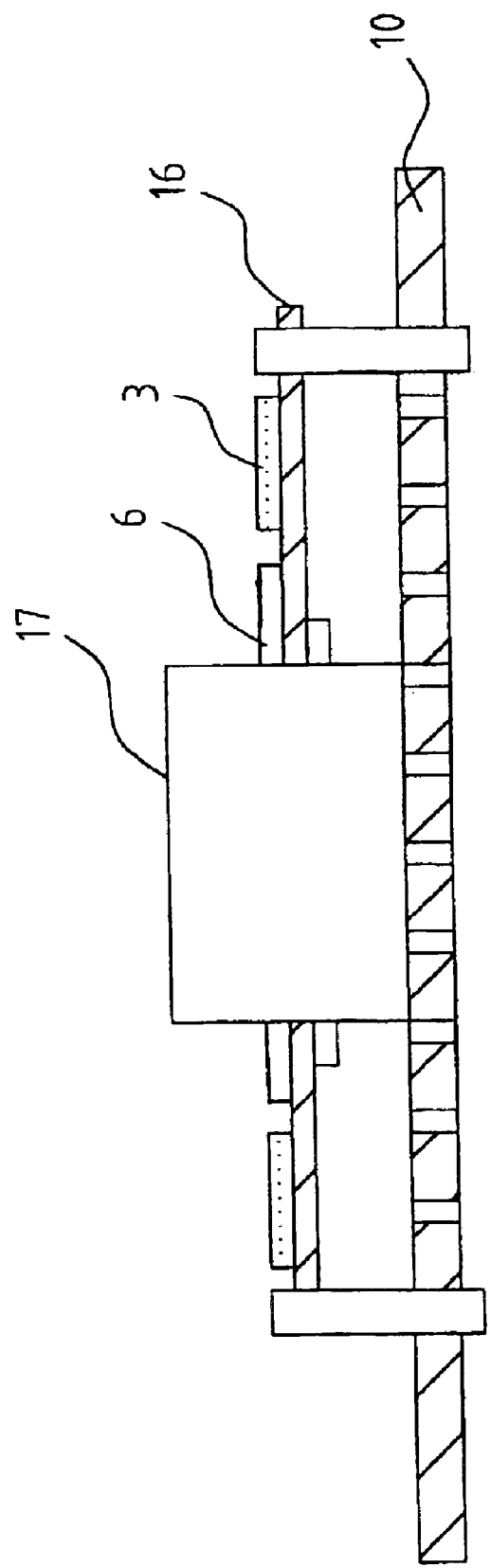
Figure 9:
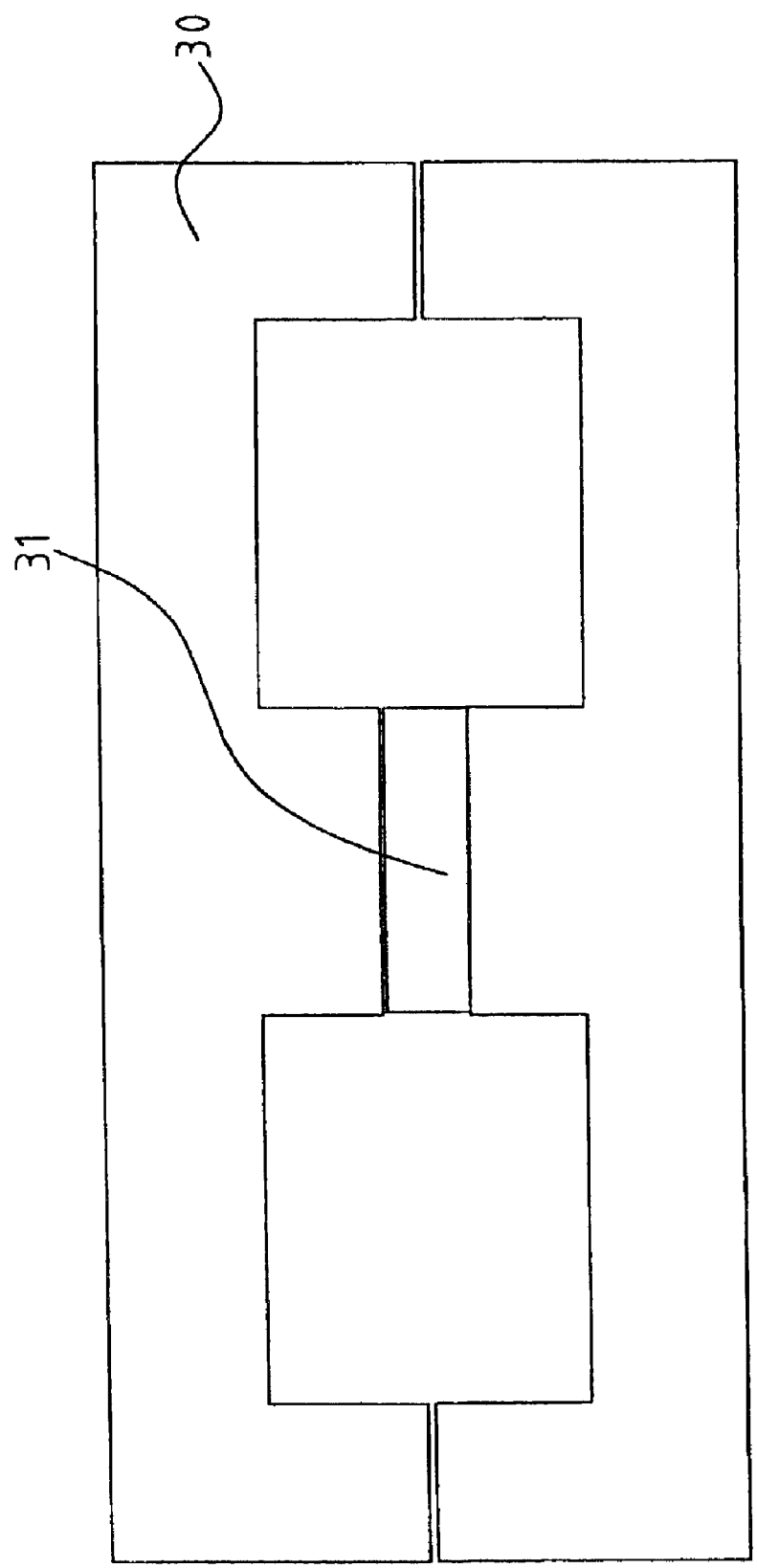
Figure 10:
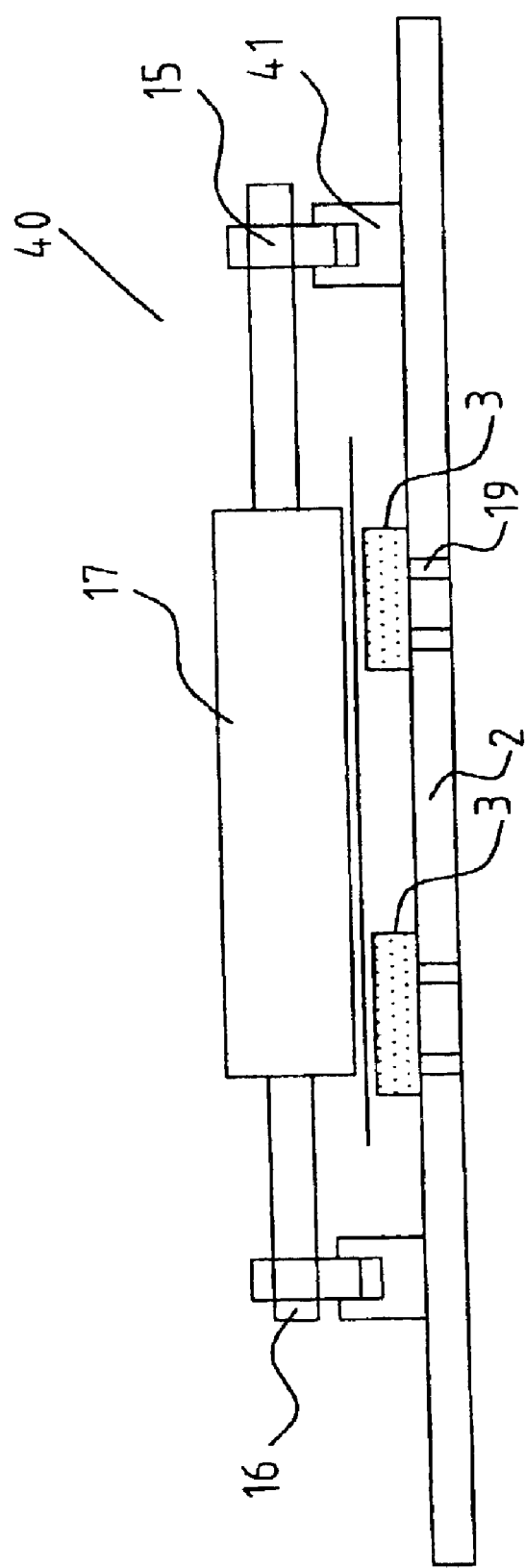

FIG. 5 is a sectional view of a magnetic element surface mount PCB according to the invention mounted on a base PCB, FIG. 6 is a plan view of a partially assembled PCB with power semi-conductor components mounted thereon, FIG. 7 is a sectional view of the PCB of FIG. 6 showing in section a magnetic component mounted thereon, FIG. 8 shows another construction of surface mount PCB according to the invention, FIG. 9 shows a magnetic component according to the invention, and FIG. 10 illustrates another construction of surface mount PCB according to the invention.

Figure 1:
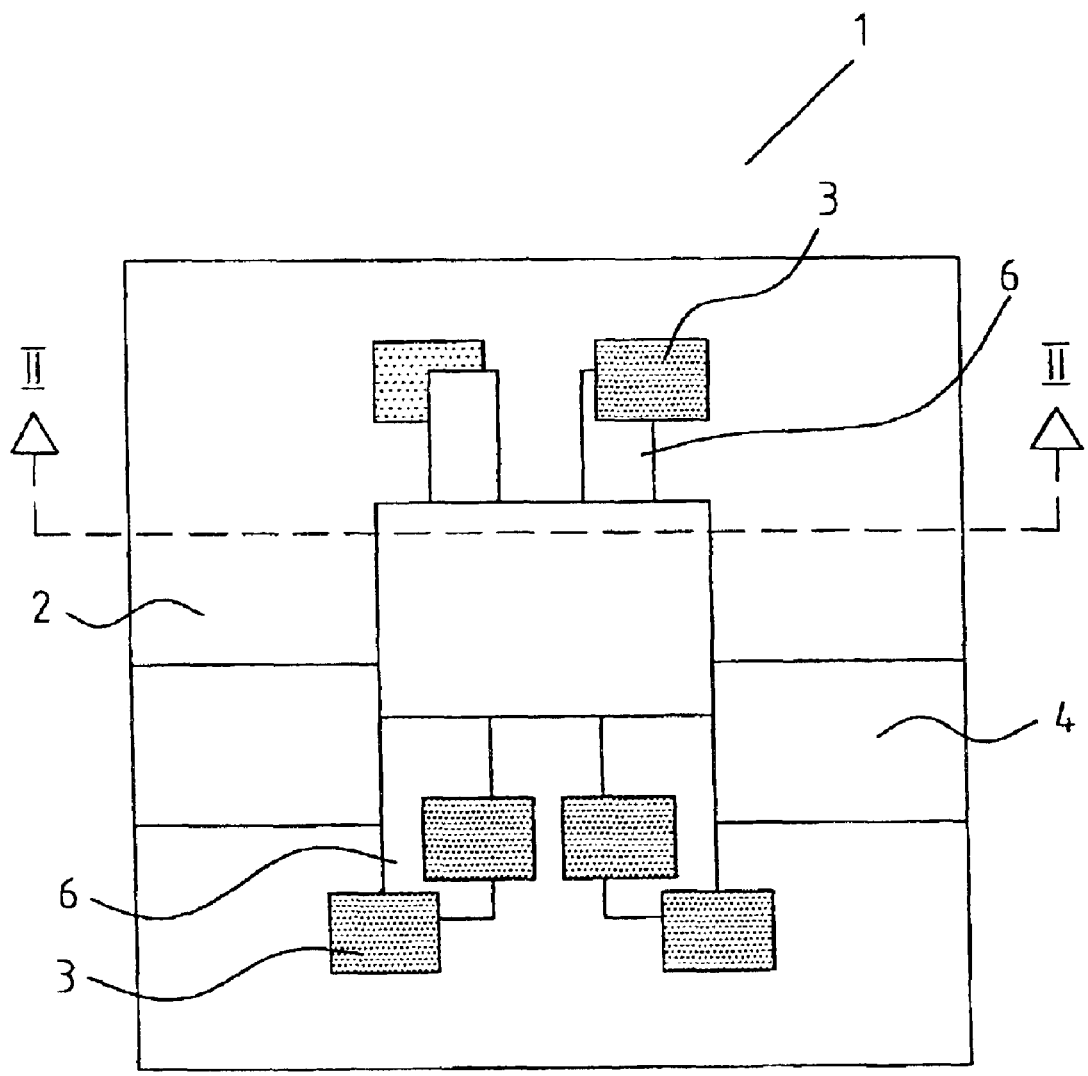
FIG. 1 is a plan view of a DC-DC power converter of single PCB board construction.
Figure 2:
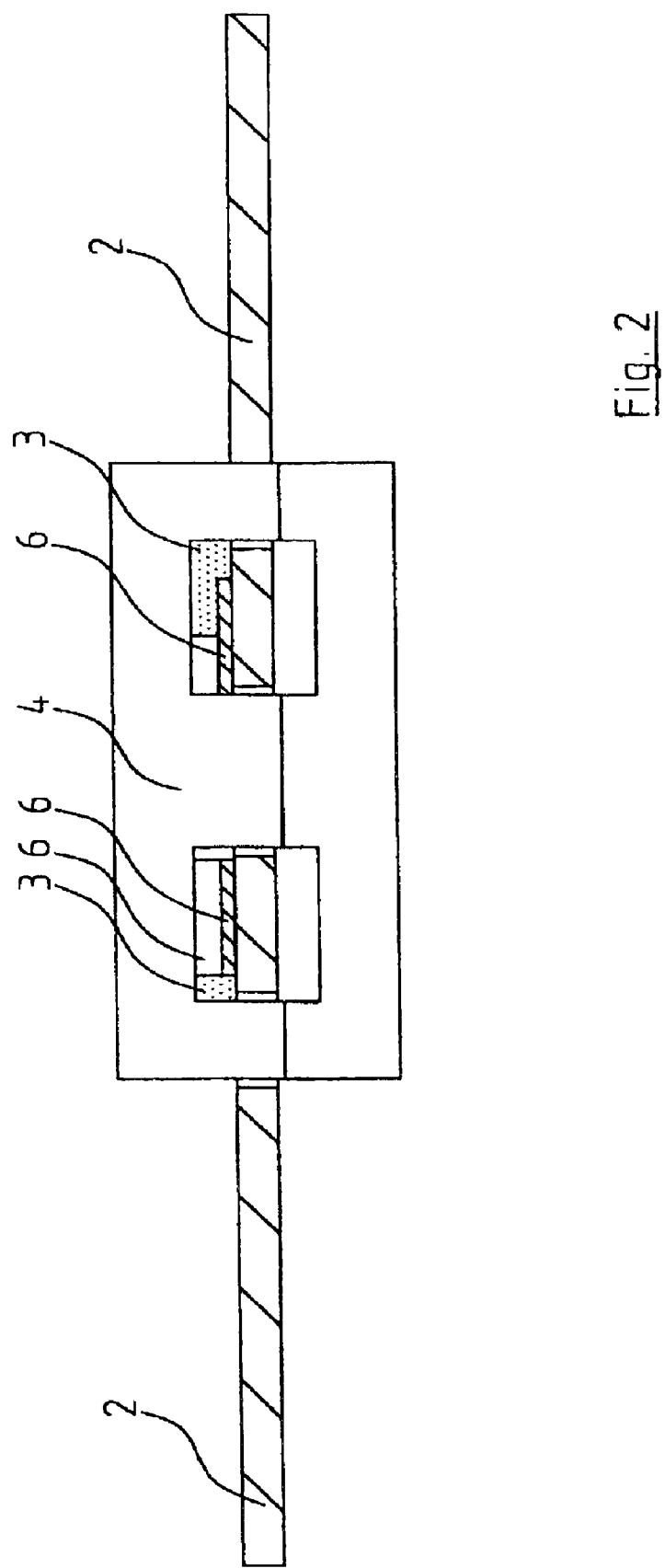
FIG. 2 is a cross sectional view in the direction of the arrows II—II of FIG. 1.

Referring to the drawings and initially to FIGS. 1 and 2, there is provided a DC-DC power converter module in the form of a PCB assembly 1 comprising a single layer 2 mounting power semi-conductor elements forming high heat generating components 3 and various cores of magnetic material forming heat dissipating components 4. The heat generating components 3 are thermally linked to the heat dissipating components 4 by tracks of a heat conductive coupling material 6. In this embodiment, the tracks 6 actually project into one of the heat dissipating components 4 and lie above or below each of the heat generating components 3 but are electrically insulated therefrom. Suitable insulating materials are used.

Referring to FIGS. 3 and 4, there is illustrated a heat coupler, indicated generally by the reference numeral 10, having a base portion 11 and tines 12. The base portion 11 is cranked so as to be coupled thermally closely to a suitable heat generating component by overlying it, but not necessarily touching it, or, if touching it, being insulated therefrom. The tines 12 would then be allowed, for example, to project into the core of a magnetic device, for example, an E-shape core, shown in section and identified by the reference numeral 13. The heat coupler 10 may be a metallic stamping, for example, copper strip, so as to allow the heat to transfer laterally from the heat generating component 3 to the heat dissipating components 4.

Referring now to FIG. 5, parts similar to those described with reference to the previous drawings are identified by the same reference numerals. In this embodiment, the PCB board 2 has mounted on it by conventional board Interconnect legs 15, a heat dissipating component formed from a separate magnetic surface mount PCB 16 mounting planar ferrite magnetic cores 17. A thermal interface sheet 18 is interposed between the magnetic core 17 and the PCB 2. Thermal vias 19 interconnect the thermal interface sheet 18 with the heat generating components 3, in this case, power semiconductor elements. The thermal vias 19 will be filled with a suitable heat conductive coupling material and similarly so will the thermal interface sheet 18 be manufactured from such a material. The surface mount PCB 16 is a multilayer printed circuit board.

Referring now to FIGS. 6 and 7, parts similar to those described with reference to the previous drawings are identified by the same reference numerals. In this embodiment, there is illustrated a heat dissipating component formed from a magnetic core 20 within which are housed heat generating components 3. A thermal connector 21 is also provided to ensure that the high heat generating components 3 are thermally linked to the high heat dissipating components, namely, the magnetic core 20.

Referring now to FIG. 8, parts similar to those described with reference to the previous drawings are identified by the same reference numerals. In this embodiment, the surface mount PCB 16 has mounted thereon a plurality of heat generating components 3 and a heat dissipating component formed from the magnetic core 17. Thermal connectors formed again from tracks of thermally conductive coupling material 6 are provided. This surface mount PCB 16 could effectively be a whole power converter which can then be readily easily mounted on the PCB assembly 1 which effectively forms a base PCB and removed therefrom when maintenance is required.

Referring now to FIG. 9, it will be appreciated that obviously heat transfer from one face of a core of magnetic material to the other face of the core magnetic material may be achieved by close alignment of mating surfaces of the magnetic material and the use of appropriate adhesives. As will be appreciated, gaps may be required in the case of inductors and transformers carrying a DC bias current.

FIG. 9 illustrates such a core of magnetic material 30 in which a gap is filled with a heat conductive coupling material, almost certainly a conformable material 31. In this embodiment, the surface mount PCB 16 is a multilayer circuit board which, it will be seen, is mounted above the power generating components 3.

FIG. 10 illustrates an alternative PCB assembly indicated generally by the reference numeral 40, in which parts similar to those described with reference to the previous drawings are identified by the same reference numerals. In this embodiment, the surface mount PCB 16 again mounts the planar ferrite magnetic core now directly over the heat generating components 3 or the PCB 2.

It will be appreciated that the heat generating and heat dissipating components can be linked without necessarily touching. Simply placing them together or one within the other, as illustrated in the drawings, will be sufficient to have good heat conductive coupling. Obviously, the use of any form of heat conductive coupling material is advantageous and in many instances, with uneven and irregular surfaces and components, a conformable heat conductive material will be particularly useful. One particular form of conformable thermally conductive but electrically insulating material is that sold under the trade mark GapPad by Bergquist Corporation. Close alignment of components and the correct choosing of components is all important.

Current ferrite materials have a thermal conductivity of the order of 5 Wm-1 K-1.

In a typical 100 W converter module using two E22 corers with a total face in contact with the printed circuit board on one side of 320 mm2 and a material thickness of 2.5 mm, the thermal impedance is about 2 K/W per face. With a typical dissipation of about 10 W, the opportunity for achieving very effective cooling of the relatively small power semiconductor devices by using the ferrite material as a heat transmission medium to an external heat dissipation surface is evident.

Various other forms of thermal conductivity can be used such as base plates, heatsinks, etc. as shown in the prior art, however, they do not form any essential elements to the present invention. The arrangement according to the present invention, allows the magnetic elements to be the main heat transfer devices from the power semi-conductor elements.

In the case of a large class of converter modules, typically those with AC input, the practical height is determined by energy storage elements such as electrolytic capacitors. There is a corresponding restriction on the area or "footprint" which can be taken up by the power conversion module. In this case, it may no longer be advantageous on grounds of cost or volumetric efficiency to use a construction technique where the magnetic elements are integrated within a single multilayer board construction.

In this case, it is advantageous to have a base printed circuit board such as illustrated in FIG. 10 in which the power semi-conductor devices are mounted below the magnetic core and use thermal vias to spread the heat within the board and/or to conduct heat to the lower face of the board. The layer count in this board can be two or four, considerably cheaper than the higher layer counts typically used in the case of planar magnetic in-board winding implementations. A low-profile implementation of the magnetic elements, with windings implemented as printed circuit boards or in another low-profile implementation and passing through the window area, may then be mounted over the base printed circuit board in the module. To assist rework and test, it is advantageous to make the magnetic assembly easily removable using a plug and socket arrangement 41 such as illustrated in FIG. 10. In the case of smaller magnetic assemblies, the use of connectors on the base printed circuit board of the module and the printed circuit board in the magnetic assembly with some retention arrangement may provide a satisfactory mechanical fixing. In the case of larger magnetic structures, such connector arrangements may be augmented by conventional fasteners.

When the low-profile magnetic structure is mounted over the base printed circuit board, there are several options in relation to its placement relative to the components below. Close thermal coupling may be achieved between components located immediately below the magnetic material typically employed, with appropriate layers of shielding and/or electrical insulation (typically thermally conductive conformable or compressible material) as required.

As an alternative, the magnetic element may be located flush with the base printed circuit board, or over low-height components, and the power semi-conductor elements may be mounted closer to the connectors filling the void that typically exists where the windings protrude beyond the core in most planar magnetic implementations. Opportunities for upward thermal transfer in this case can include use of the connectors and cabling in order to achieve material power dissipation, along with use of heat spreaders to achieve thermal coupling to the magnetic material.

Measures can be taken as above to improve the face-to-face thermal conductivity of the magnetic material, including careful thermal management at interfaces, as outlined above.

Given an E64 core set in El configuration, and assuming the transmission is only through the ferrite (i.e. no transmission through the winding window), a face-to-face thermal resistance assuming a ferrite thermal conductivity of 4 Wm-1 K-1 is calculated as 3.7 K/W. This figure can be increased by greater thermal "filing" of the magnetic window and as magnetic matenals improve, but is a figure which may achieve a satisfactory cooling effect in the case of many circuit configurations.

The invention provides a relatively simple way of improving the thermal performance of such PCBs by ensuring that the high heat generating components are thermally linked to the high heat dissipating components, whether they be directly coupled by a heat conductive coupling material or simply placed very close to each other. In certain cases, there may even be contact. Additional heat conductive tracks, pads, thermal vias, etc. may all be used. The invention does not envisage limiting in any way the number of layers or tracks making up the PCB.

Also, it will be appreciated that the provision, according to the prevent invention, of a separate magnetic surface mount PCB carrying plug-in legs for mounting on the base PCB is particularly advantageous. A multilayered circuit board is often used to provide planar magnetics which, if they need to be replaced, can only be replaced with difficulty. Both heat dissipating components and heat generating components will be connected and linked to more than one or other components. It will also be appreciated that it will be necessary to ensure that generating and dissipating components having different thermal attributes over the PCB operating range, are chosen such as to ensure that optimum heat management performance is achieved over the full PCB operating range.

It will be appreciated that power converters manufactured in accordance with the invention will be particularly advantageous in use.

In the specification the terms "comprise, comprises, comprised and comprising" or any variation thereof and the terms "include, includes, included and including" or any variation thereof are considered to be totally interchangeable and they should all be afforded the widest possible interpretation.

The invention is not limited to the embodiments hereinbefore described but may be varied within the scope of the claims.

What is claimed is:

1. A printed circuit board (PCB) assembly comprising:
   a plurality of components in said PCB assembly having two sets of different thermal properties over an operating range of said PCB assembly;
   a first component set having heat generating properties;
   a second component set having heat dissipating and magnetic properties;
   means for thermally linking said first component set to said second component set whereby heat generated by at least one component from said first component set is dissipated by at least one component from said second component set.

2. The PCB as claimed in claim 1 wherein the thermally linking means comprises a heat conductive coupling material to couple at least one component from said first component set to at least one component from said second component set.

3. The PCB as claimed in claim 2, in which said heat conductive coupling material is in direct contact with one of said components.

4. The PCB as claimed in claim 2, in which said heat conductive coupling material is housed within at least one of said components.

5. The PCB as claimed in claim 2, in which said heat conductive coupling material forms tracks on said board.

6. The PCB as claimed in claim 2, in which said heat conductive coupling material forms pads on said board.

7. The PCB as claimed in claim 2, in which said heat conductive coupling material forms thermal vias with one component on one side of said board and said other component on the opposite side.

8. The PCB as claimed in claim 2, in which said heat conductive coupling material is a conformable thermally conductive material.

9. The PCB as claimed in claim 1, in which said components are in close physical proximity with minimal air gap between them.

10. The PCB as claimed in claim 1, in which said heat-generating component is housed at least partially within said heat-dissipating component.

11. The PCB as claimed in claim 1, in which said heat dissipating component is mounted above the heat generating component.

12. The PCB as claimed in claim 1, in which a magnetic component from said second component set is a separate magnetic surface mount PCB carrying plug-in interconnect legs for mounting on said board.

13. The PCB as claimed in claim 12, in which said surface mount PCB is a multilayer circuit board.

14. The PCB as claimed in claim 12, in which said surface mount PCB forms part of a power converter comprising power semi-conductors on said board below said surface mount PCB and in which a layer of conformable thermally conductive material fills the space between the bottom of said surface mount PCB and said power semi-conductors.

15. The PCB as claimed in claim 1, in which said heat-dissipating component is thermally linked to more than one heat-generating component.

16. The PCB as claimed in claim 1, in which said heat-generating component is thermally linked to more than one heat-dissipating component.

17. The PCB as claimed in claim 1, in which when said heat generating and said dissipating components have different thermal attributes over said PCB operating range, the choice of components for thermal linking is chosen to provide optimum heat transfer over said PCB operating range.

18. A printed circuit board (PCB) assembly comprising:
   a plurality of components in said PCB assembly having two sets of different thermal properties over an operating range of said PCB assembly;
   a first component set having heat generating properties;
   a second component set having heat dissipating and/or magnetic properties, at least one component comprising a magnetic element having a separate magnetic element surface mount PCB carrying plug-in legs for mounting on said board of said PCB assembly;
   means for thermally linking said first component set to said second component set whereby heat generated by at least one component from said first component set is dissipated by at least one component from said second component set.

19. The PCB as claimed in claim 18 wherein the thermally linking means comprises a heat conductive coupling material to couple at least one component from said first component set to at least one component from said second component set.

20. The PCB as claimed in claim 18, in which said magnetic element surface mount PCB is a multilayer circuit board.

21. A power converter having a printed circuit board (PCB) assembly comprising:
   a plurality of power semi-conductor components in said PCB assembly having two sets of different thermal properties over an operating range of several PCB assembly;

a first component set having heat generating properties;

a second component set having heat dissipating and/or magnetic properties, at least one component comprising a magnetic element having a separate magnetic element surface mount PCT carrying plug-in legs for mounting on said board of said PCB assembly;

means for thermally linking said first component set to said second component set whereby heat generated by at least one component from said first component set is dissipated by at least one component from said second component set.

22. The power converter as claimed in claim 21 wherein the thermally linking means comprises a heat conductive coupling material to couple at least one component from said first component set to at least one component from said second component set.

23. The power converter as claimed in claim 21, in which said surface mount PCB is arranged above said semiconductor elements.

24. The power converter as claimed in claim 21, in which a layer of conformable thermally conductive material fills the space between the bottom of said surface mount PCB and said power semi-conductors.

* * * * *